(12) United States Patent
Hammerschmidt

(10) Patent No.: US 11,002,567 B2
(45) Date of Patent: May 11, 2021

(54) ANGLE SENSOR BRIDGES INCLUDING STAR-CONNECTED MAGNETORESISTIVE ELEMENTS

(71) Applicant: Infineon Technologies AG, Neubiberg (DE)

(72) Inventor: Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/816,920

(22) Filed: Mar. 12, 2020

(65) Prior Publication Data

US 2020/0217690 A1 Jul. 9, 2020

Related U.S. Application Data

(62) Division of application No. 15/620,405, filed on Jun. 12, 2017, now Pat. No. 10,605,626.

(51) Int. Cl.
*G01D 5/16* (2006.01)
*G01R 33/09* (2006.01)
(Continued)

(52) U.S. Cl.
CPC .......... *G01D 5/1655* (2013.01); *G01D 5/145* (2013.01); *G01R 33/00* (2013.01); *G01R 33/02* (2013.01)

(58) Field of Classification Search
CPC .......... G01D 5/16; G01D 5/1655; G01D 5/20; G01D 5/244; G01R 33/00; G01R 33/02;
(Continued)

(56) References Cited

U.S. PATENT DOCUMENTS 10,605,626 B2 3/2020 Hammerschmidt
2009/0115405 A1* 5/2009 Guo ........................ G01D 5/145
324/207.14
(Continued)

FOREIGN PATENT DOCUMENTS

CN 201653353 U 11/2010
CN 102032863 A 4/2011
(Continued)

OTHER PUBLICATIONS

Bartos A., et al., "Novel Redundant Magnetoresistive Angle Sensors," http://citeseerx.ist.psu.edu/viewdoc/download:isessionid=C5A70BB95BAB5093695995C29090120E9D?doi=10.1.1.429.5806&rep1&type=pdf, 2006, 4 pages.

*Primary Examiner* — Neel D Shah
(74) *Attorney, Agent, or Firm* — Harrity & Harrity, LLP

(57) ABSTRACT

An angle sensor may comprise a sensing element including a first half bridge, where magnetic reference directions of resistors of the first half bridge are along a first reference axis. The sensing element may include a second half bridge, where magnetic reference directions of resistors of the second half bridge are along a second reference axis. The sensing element may include a third half bridge, where magnetic reference directions of resistors of the third half bridge are along a third reference axis. At least two of the first reference axis, the second reference axis, or the third reference axis may be non-orthogonal to each other.

20 Claims, 12 Drawing Sheets

(51) Int. Cl.
  *G01D 5/165*  (2006.01)
  *G01D 5/14*  (2006.01)
  *G01R 33/02*  (2006.01)
  *G01R 33/00*  (2006.01)

(58) Field of Classification Search
  CPC ............ G01R 33/0017; G01R 33/0029; G01R 33/0035; G01R 33/0082; G01R 33/09; G01B 7/14; G01B 7/30
  See application file for complete search history.

(56) References Cited

U.S. PATENT DOCUMENTS

| | | | |
|---|---|---|---|
| 2011/0025319 A1* | 2/2011 | Saruki | G01R 33/0029 |
| | | | 324/252 |
| 2011/0087456 A1* | 4/2011 | Satou | B62D 15/0235 |
| | | | 702/151 |
| 2012/0095712 A1* | 4/2012 | Komasaki | G01D 3/036 |
| | | | 702/94 |
| 2015/0137797 A1 | 5/2015 | Ausserlechner et al. | |
| 2015/0178403 A1 | 6/2015 | King | |
| 2016/0178403 A1 | 6/2016 | Bilger et al. | |

FOREIGN PATENT DOCUMENTS

| | | |
|---|---|---|
| CN | 104976948 A | 10/2015 |
| CN | 105305914 A | 2/2016 |
| CN | 106357164 A | 1/2017 |
| DE | 102004019238 B3 | 8/2005 |

\* cited by examiner

ANGLE SENSOR BRIDGES INCLUDING STAR-CONNECTED MAGNETORESISTIVE ELEMENTS

RELATED APPLICATION

This application is a divisional of U.S. patent application Ser. No. 15/620,405, filed Jun. 12, 2017 (now U.S. Pat. No. 10,605,626), which is incorporated herein by reference.

BACKGROUND

A magnetic angle sensor may be used to determine an orientation of a magnetic field (e.g., an angle between zero degrees and three hundred and sixty degrees) produced by a magnet. The magnetic angle sensor may be a Hall-effect sensor, a magnetoresistive (MR)-based sensor, a variable reluctance sensor (VRS), a fluxgate sensor, or the like.

SUMMARY

According to some possible implementations, an angle sensor may comprise a sensing element including a first half bridge, associated with a first reference axis, that includes a first resistor and a second resistor, where a magnetic reference direction of the first resistor is opposite from a magnetic reference direction of the second resistor, where the magnetic reference direction of the first resistor and the magnetic reference direction of the second resistor are along the first reference axis; a second half bridge, associated with a second reference axis, that includes a third resistor and a fourth resistor, where a magnetic reference direction of the third resistor is opposite from a magnetic reference direction of the fourth resistor, where the magnetic reference direction of the third resistor and the magnetic reference direction of the fourth resistor are along the second reference axis; and a third half bridge, associated with a third reference axis, that includes a fifth resistor and a sixth resistor, where a magnetic reference direction of the fifth resistor is opposite from a magnetic reference direction of the sixth resistor, where the magnetic reference direction of the fifth resistor and the magnetic reference direction of the sixth resistor are along the third reference axis, and where at least two of the first reference axis, the second reference axis, or the third reference axis are non-orthogonal to each other.

According to some possible implementations, an apparatus, may include a sensing element to: provide a first voltage signal, a second voltage signal, and a third voltage signal, the sensing element including a set of MR elements arranged with respect to a first reference axis, a second reference axis, and a third reference axis, the set of MR elements including a first half bridge associated with the first reference axis, a second half bridge associated with the second reference axis, and a third half bridge associated with the third reference axis, and at least one of the first reference axis, the second reference axis, or the third reference axis is non-orthogonal to at least one other of the first reference axis, the second reference axis, and the third reference axis; and a processor to: receive the first voltage signal, the second voltage signal, and the third voltage signal; and determine, based on the first voltage signal, the second voltage signal, and the third voltage signal, an angle of rotation of a magnetic field applied to the sensing element.

According to some possible implementations, a magnetic sensor may include: a sensing element to provide a first output signal, a second output signal, and a third output signal, the sensing element including: at least two MR elements with magnetic reference directions along a first reference axis, at least two MR elements with magnetic reference directions along a second reference axis, and at least two MR elements having magnetic reference directions along a third reference axis, where at least one of the first reference axis, the second reference axis, or the third reference axis is non-orthogonal to at least one other of the first reference axis, the second reference axis, and the third reference axis; and a processor to perform a functional safety check, associated with the magnetic sensor, based on the first output signal, the second output signal, and the third output signal.

DETAILED DESCRIPTION

Figure 1:
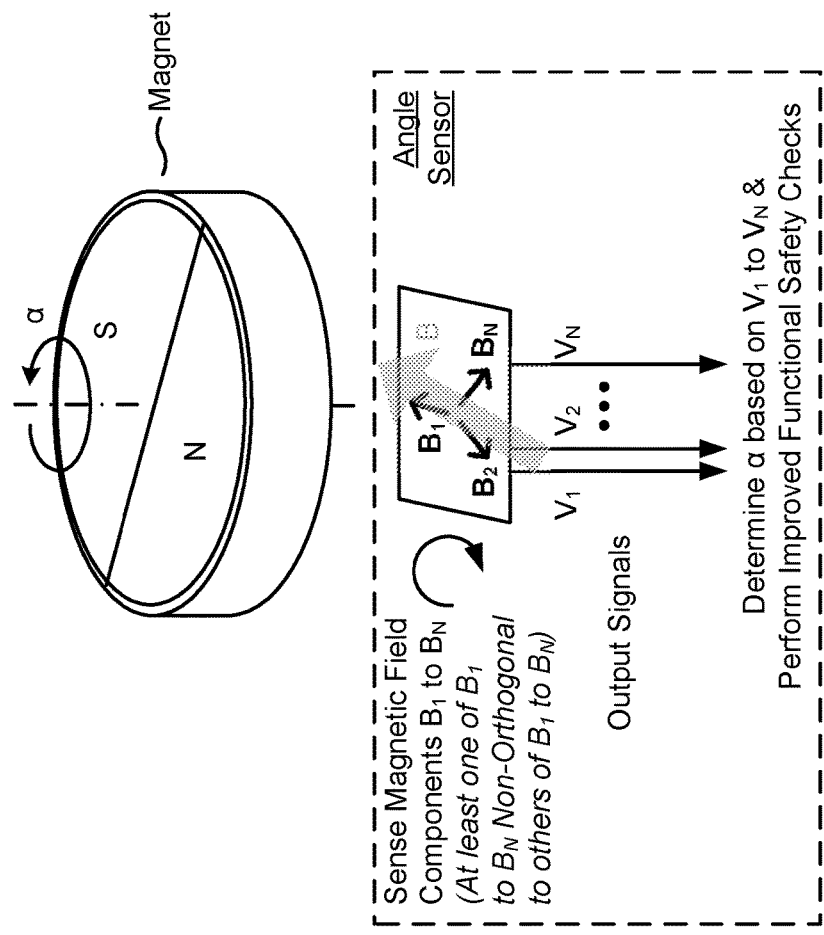
FIG. 1 is a diagram of an overview of an example implementation described herein.

The following detailed description of example implementations refers to the accompanying drawings. The same reference numbers in different drawings may identify the same or similar elements.

A magnetic angle sensor, such as an MR-based angle sensor, may include two sensing elements (e.g., a pair of Wheatstone bridges) that are arranged to provide output signals corresponding to two orthogonal components of a magnetic field (parallel to active surfaces of the sensing elements), such as a y-component of the magnetic field and an x-component of the magnetic field. The angle sensor may provide these output signals (e.g., a voltage signal $V_y$ and a voltage signal $V_x$), and an angle of rotation ($\alpha$) of a magnet that generates the magnetic field (and an angle of rotation of a rotatable object to which the magnetic is connected) may be calculated based on the output signals corresponding to the two orthogonal components (e.g., $\alpha = \arctan(V_y/V_x)$).

In some cases, a functional safety check may be implemented in the angle sensor. For example, a vector length associated with the output signals (e.g., a vector length equal to $V_x^2 + V_y^2$) may be monitored during operation of the angle sensor as a functional safety check. In this example, if the vector length remains substantially constant during operation of the angle sensor (e.g., after calibration and/or temperature compensation), then safe operation of the angle sensor may be assumed. However, such a functional safety check (e.g., based on two output signals) has limited accuracy and/or may have insufficient diagnostic coverage due to being dependent on absolute values of the output signals.

In some cases, functional safety may be improved by including another sensing element in the angle sensor, where the other sensing element is arranged to provide an output signal corresponding to another component of the magnetic field (e.g., a component of the magnetic field that is non-orthogonal to the x-component and the y-component, such as a component at a 45 degree angle from both the x-component and the y-component). However, addition of the other sensing element increases cost, complexity, and size of the angle sensor.

Implementations described herein provide an angle sensor with a sensing element that provides output signals associated with multiple (e.g., three or more) components of a magnetic field, where at least one of the multiple components of the magnetic field is non-orthogonal to one or more (e.g., each) other of the multiple components of the magnetic field. The output signals, associated with the multiple components, may be used to determine the angle of rotation, and may allow for improved and/or additional functional safety checks, increased reliability, diversity, and/or redundancy (e.g., as compared to an angle sensor without such a sensing element). Moreover, the sensing element of the angle sensor includes fewer elements (e.g., resistors, connections, or the like) than the angle sensor described above, thereby reducing cost and/or complexity of the angle sensor while providing improved functional safety.

FIG. 1 is a diagram of an overview of an example implementation 100 described herein. As shown in FIG. 1, a magnet (e.g., mechanically connected to a rotatable object) may rotate about an axis (e.g., an axis through a center of the magnet) and produce a rotating magnetic field (B). As shown, an angle sensor, associated with measuring an angle of rotation ($\alpha$) of the magnet, may include a sensing element arranged to sense N (N>2) components of the magnetic field (e.g., $B_1$ through $B_N$). At least one component of the N components of the magnetic field is non-orthogonal (e.g., at an angle greater than or less than 90 degrees) to each of the other components of the N components. In some implementations, each of the N components may be non-orthogonal to each of the other N components. Additionally, or alternatively, the N components may be evenly spaced over a 360 degree rotation with respect to an active surface of the sensing element. Additional details regarding examples of such sensing elements are described below.

As shown, the sensing element may provide output signals (e.g., voltage signals $V_1$ through $V_N$) corresponding to the components of the magnetic field $B_1$ through $B_N$. As further shown, the angle sensor may determine the angle of rotation based on the output signals.

As further shown, the angle sensor may also perform one or more functional safety checks based on the output signals. For example, a sum associated with the output signals (e.g., $V_1+V_2+\ldots+V_N$) may be monitored during operation of the angle sensor as a functional safety check. As another example, a vector length associated with the output signals (e.g., $V_1^2+V_2^2+V_N^2$) may be monitored during operation of the angle sensor as a functional safety check. As another example, the angle sensor may determine N different angles of rotation (e.g., $\alpha_1, \alpha_2, \ldots, \alpha_N$) based on the output signals, and may compare the N different angles of rotation as a functional safety check. Such functional safety checks (e.g., based on N output signals) have improved accuracy and/or improved diagnostic coverage as compared to those associated with an angle sensor that does not include the sensing element described with regard to FIG. 1. Moreover, the angle sensor, by providing the N output signals, may perform additional functional safety checks and achieve increased reliability, diversity, and/or redundancy, while reducing size, cost and/or complexity (e.g., as compared to an angle sensor without the sensing element described with regard to FIG. 1).

As indicated above, FIG. 1 is provided merely as an example. Other examples are possible and may differ from what was described with regard to FIG. 1.

Figure 2:
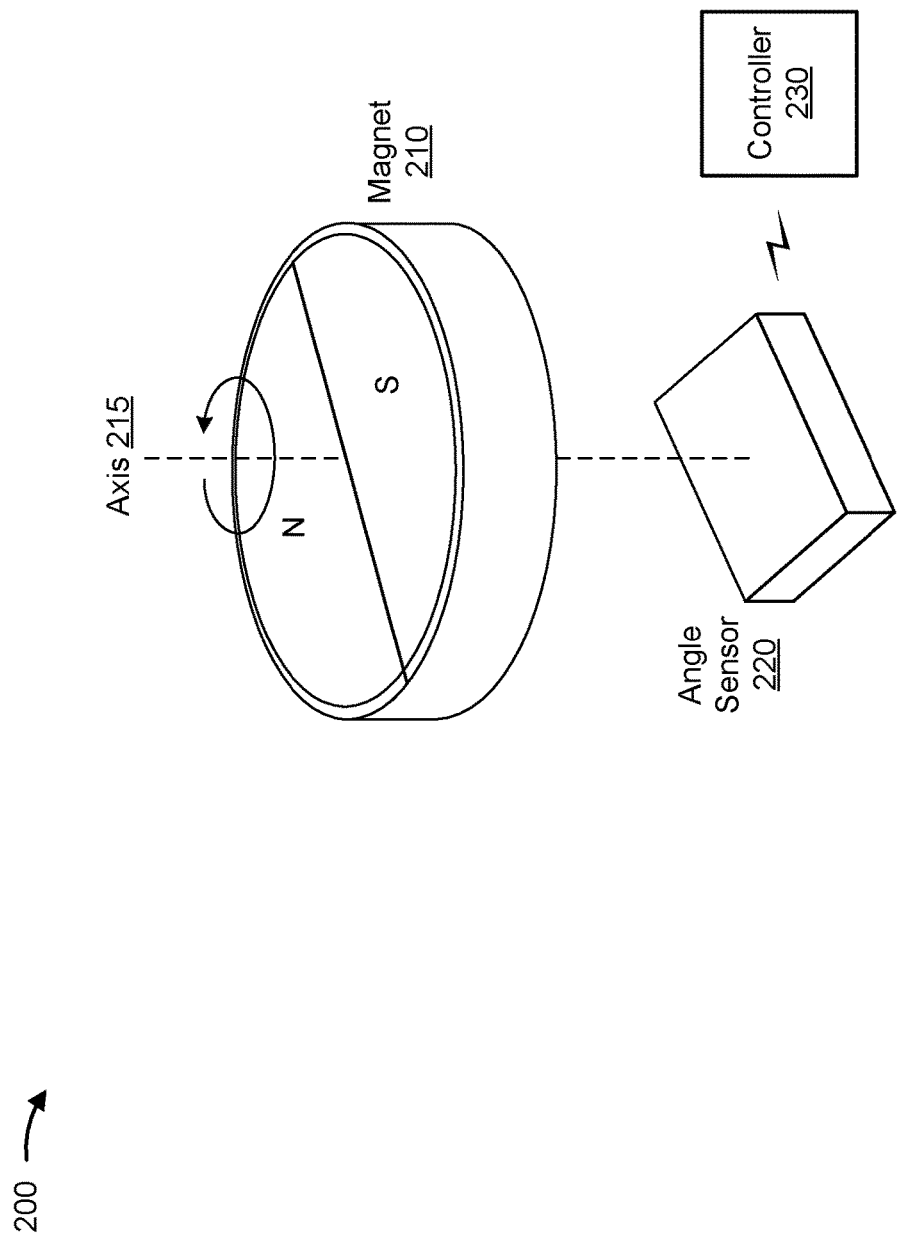
FIG. 2 is a diagram of an example environment in which systems and/or methods, described herein, may be implemented.

FIG. 2 is a diagram of an example environment 200 in which apparatuses described herein may be implemented. As shown in FIG. 2, environment 200 may include a magnet 210 that may rotate about an axis 215, an angle sensor 220, and a controller 230.

Magnet 210 may include one or more magnets positioned to rotate about axis 215 (e.g., an imaginary line). In some implementations, magnet 210 may be connected (e.g., mechanically) to a rotatable object (not shown) such that a rotation angle of magnet 210 corresponds to a rotation angle of the rotatable object (e.g., when there exists a non-slip relation between an end face of the rotatable object and magnet 210).

In the example environment 200 shown in FIG. 2, magnet 210 comprises a first half forming a north pole (N) and a second half forming a south pole (S), so that magnet 210 comprises one pole pair. In some implementations, magnet 210 may, without limitation, comprise more than one pole pair. In some implementations, magnet 210 may include a disk magnet that is positioned concentrically about axis 215 that passes through the center of magnet 210, as shown in FIG. 2. While magnet 210 is shown as circular in FIG. 2, magnet 210 may be another shape, such as a square, a rectangular, an ellipse, or the like. For example, magnet 210 may be of an elliptical shape in an instance where an angle between a plane corresponding to a surface of magnet 210 and axis 215 deviates from a substantially perpendicular relation. The plane may include a plane symmetrically cutting through magnet 210 and including a magnet center of magnet 210. In practical cases, the plane may be substantially perpendicular to axis 215. As another example, magnet 210 may include a ring magnet that is positioned to rotate about axis 215 (along with the rotatable object). A ring magnet may be of interest for an arrangement of magnet 210 at an end of the rotatable object.

In some implementations, magnet 210 may include two alternating poles on at least two portions of magnet 210. For example, magnet 210 may include a diametrally magnetized magnet with a north pole on a first half of magnet 210 and a south pole on a second half of magnet 210, as shown in FIG. 2. As another example, magnet 210 may include an axially magnetized magnet with a first north pole and a first south pole stacked on a first half of magnet 210, and a second south pole and a second north pole stacked on a second half of magnet 210 (not shown).

Additionally, or alternatively, magnet 210 may include a dipole magnet (e.g., a dipole bar magnet, a circular dipole magnet, an elliptical dipole magnet, etc.), a permanent magnet, an electromagnet, a magnetic tape, or the like. Magnet 210 may be comprised of a ferromagnetic material (e.g., Hard Ferrite), and may produce a magnetic field. Magnet 210 may further comprise a rare earth magnet which may be of advantage due to an intrinsically high magnetic field strength of rare earth magnets. As described above, in some implementations, magnet 210 may be attached to or coupled with a rotatable object for which a rotation angle may be determined (e.g., by angle sensor 220, by controller 230) based on a rotation angle of magnet 210.

Angle sensor 220 may include one or more apparatuses for sensing components of a magnetic field for use in determining an angle of rotation (e.g., of magnet 210, of a rotatable object to which magnet 210 is connected, etc.). For example, angle sensor 220 may include one or more circuits (e.g., one or more integrated circuits). In some implementations, angle sensor 220 may be placed at a position relative to magnet 210 such that angle sensor 220 may detect components of the magnetic field produced by magnet 210. In some implementations, angle sensor 220 may include an integrated circuit that includes an integrated controller 230 (e.g., such that an output of angle sensor 220 may include information that describes a rotation angle of magnet 210 and/or the rotatable object). In some implementations, angle sensor 220 may include a sensing element configured to sense components of the magnetic field, produced by magnet 210, that are present at angle sensor 220. Additional details regarding angle sensor 220 are described below with regard to FIG. 3.

Controller 230 may include one or more circuits associated with determining a rotation angle of magnet 210, and providing information associated with the rotation angle of magnet 210 and hence the rotation angle of the rotatable object to which magnet 210 is connected. For example, controller 230 may include one or more circuits (e.g., an integrated circuit, a control circuit, a feedback circuit, etc.). Controller 230 may receive input signals from one or more sensors, such as one or more angle sensors 220, may process the input signals (e.g., using an analog signal processor, a digital signal processor, etc.) to generate an output signal, and may provide the output signal to one or more other devices or systems. For example, controller 230 may receive one or more input signals from angle sensor 220, and may use the one or more input signals to generate an output signal comprising the angular position of magnet 210 and/or the rotatable object to which magnet 210 is connected.

The number and arrangement of apparatuses shown in FIG. 2 are provided as an example. In practice, there may be additional apparatuses, fewer apparatuses, different apparatuses, or differently arranged apparatuses than those shown in FIG. 2. Furthermore, two or more apparatuses shown in FIG. 2 may be implemented within a single apparatus, or a single apparatus shown in FIG. 2 may be implemented as multiple, distributed apparatuses. Additionally, or alternatively, a set of apparatuses (e.g., one or more apparatuses) of environment 200 may perform one or more functions described as being performed by another set of apparatuses of environment 200.

Figure 3:
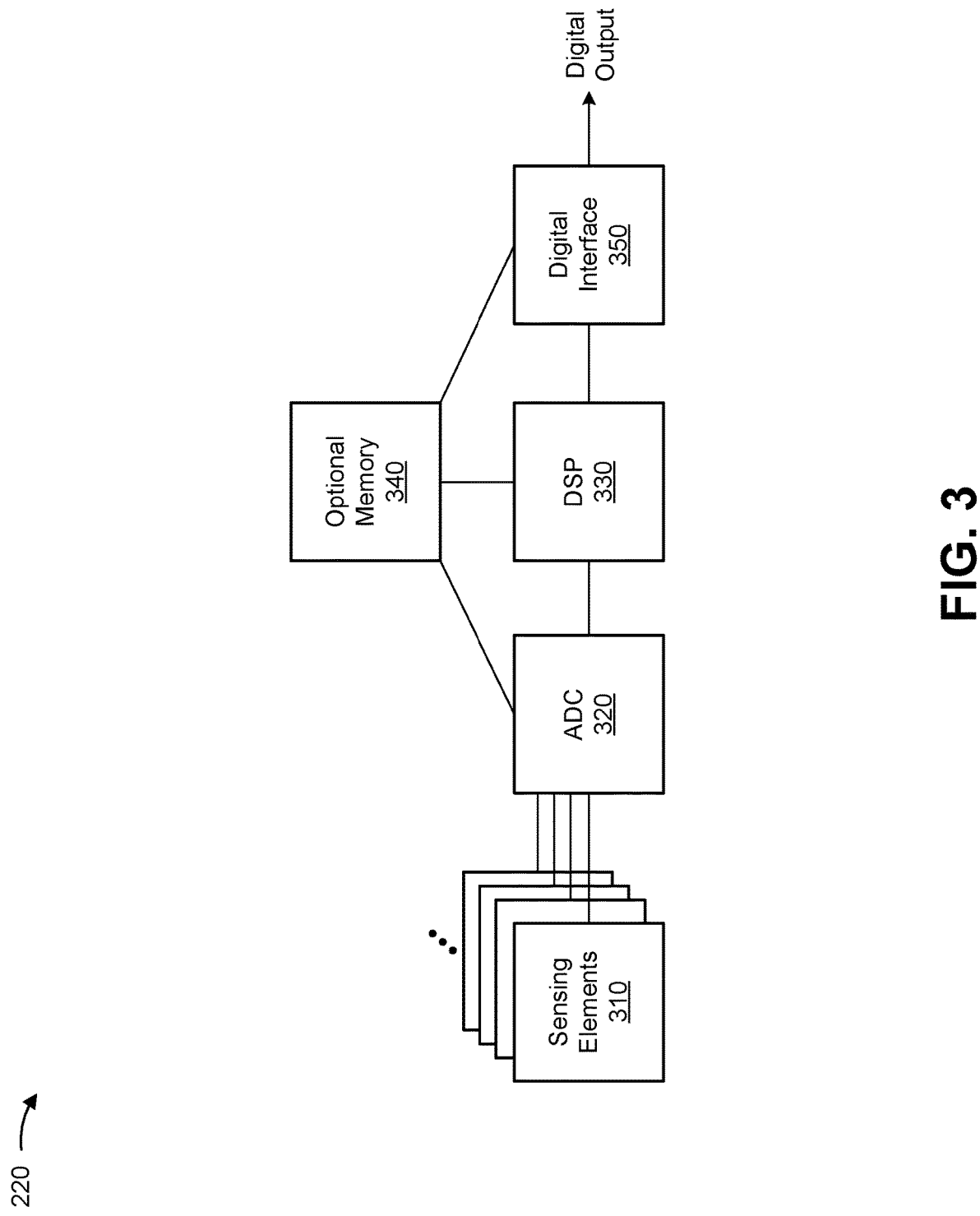
FIG. 3 is a diagram of example elements of an angle sensor included in the example environment of FIG. 2.

FIG. 3 is a diagram of example elements of angle sensor 220 included in example environment 200 of FIG. 2. As shown, angle sensor 220 may include a sensing element 310, an analog-to-digital convertor (ADC) 320, a digital signal processor (DSP) 330, an optional memory element 340, and a digital interface 350.

Sensing element 310 may include an element for sensing one or more components of a magnetic field present at angle sensor 220 (e.g., the magnetic field generated by magnet 210). For example, sensing element 310 may include a MR-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 310 may operate based on an anisotropic magnetoresistance (AMR) effect, a giant magnetoresistance (GMR) effect, a tunnel magnetoresistance (TMR) effect, or the like. As another example, sensing element 310 may include a Hall-based sensing element that operates based on a Hall-effect. As an additional example, sensing element 310 may include a variable reluctance (VR) based sensing element that operates based on induction. In some implementations, angle sensor 220 may include multiple sensing elements 310. Additional details regarding sensing element 310 are described below.

ADC 320 may include an analog-to-digital converter that converts an analog signal from the set of sensing elements 310 to a digital signal. For example, ADC 320 may convert analog signals, received from the set of sensing elements 310, into digital signals to be processed by DSP 330. ADC 320 may provide the digital signals to DSP 330. In some implementations, angle sensor 220 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for controller 230 as shown in FIG. 2), such as output signals associated with determining the rotation angle of magnet 210 rotating with a rotatable object.

Optional memory element 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by angle sensor 220. In some implementations, optional memory element 340 may store information associated with processing performed by DSP 330. Additionally, or alternatively, optional memory element 340 may store configurational values or parameters for the set of sensing elements 310 and/or information for one or more other elements of angle sensor 220, such as ADC 320 or digital interface 350.

Digital interface 350 may include an interface via which angle sensor 220 may receive and/or provide information from and/or to another device, such as controller 230 (see FIG. 2). For example, digital interface 350 may provide the output signal, determined by DSP 330, to controller 230 and may further receive information from the controller 230.

The number and arrangement of elements shown in FIG. 3 are provided as an example. In practice, angle sensor 220 may include additional elements, fewer elements, different elements, or differently arranged elements than those shown in FIG. 3. Additionally, or alternatively, a set of elements (e.g., one or more elements) of angle sensor 220 may perform one or more functions described as being performed by another set of elements of angle sensor 220.

Figure 4A:
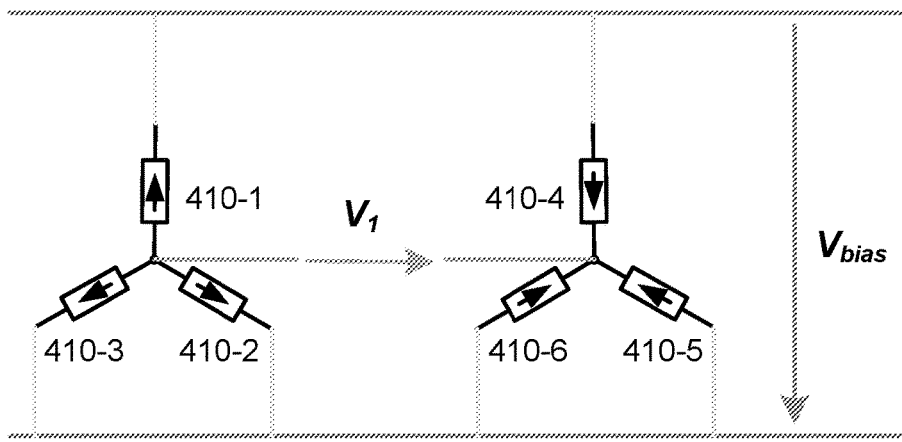
FIGS. 4A-4E are diagrams associated with an example implementation of a sensing element included in the angle sensor of FIG. 2.
Figure 4B:
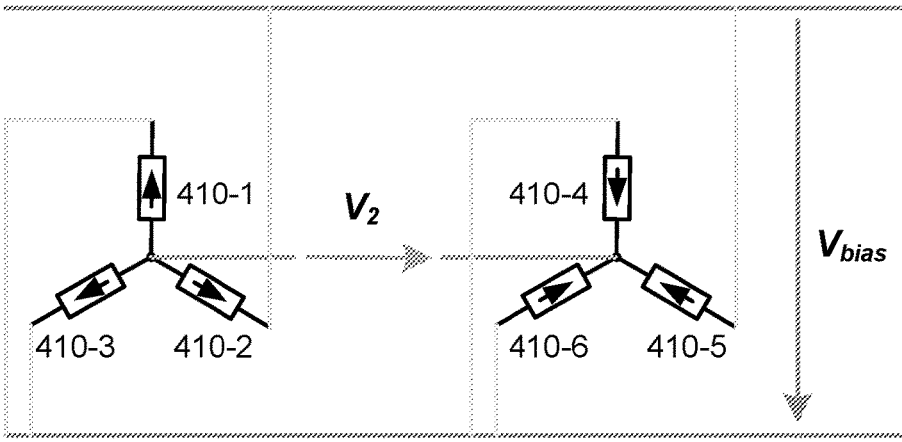
Figure 4C:
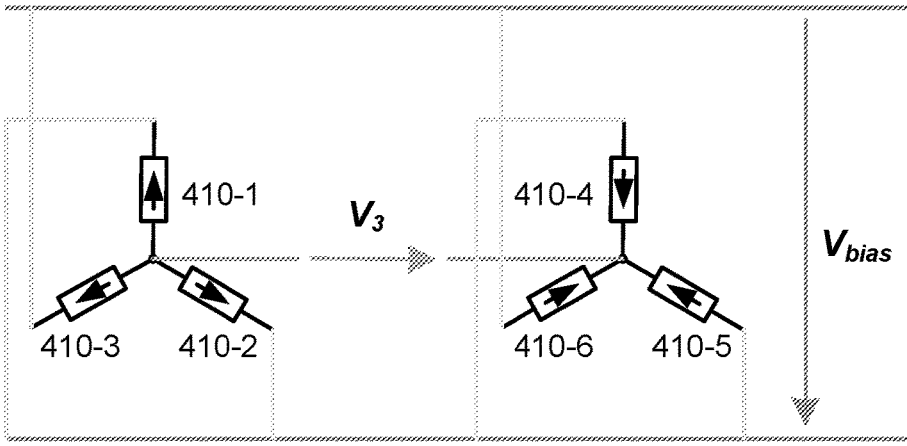

FIGS. 4A-4E are diagrams associated with an example implementation of sensing element 310 included in angle sensor 220. FIGS. 4A-4C show an example bridge 400 of sensing element 310 in angle sensor 220. As shown in FIGS. 4A-4C, in some implementations, bridge 400 may include resistors 410-1 through 410-6.

Bridge 400 includes one or more circuits that provide output signals based on a direction (e.g., an angle) of a magnetic field applied to bridge 400. In some implementations, example bridge 400 may be coupled to a power supply in order to receive an input voltage signal (identified as $V_{bias}$ in FIGS. 4A-4C). In some implementations, bridge 400 may be further coupled to a ground (not shown). As described in further detail below, output signals (e.g., voltages, output signals, output voltages, output voltage signals, or the like) provided by bridge 400 may be used to determine the angle of rotation of magnet 210 and/or to perform one or more functional safety checks associated with angle sensor 220.

Resistor 410 may include a resistor, such as an MR-based resistor, with an electrical resistance that depends on an angle of an in-plane component of a magnetic field applied to resistor 410 (i.e., a component of the magnetic field that is parallel to an active surface of resistor 410). The angle of the magnetic field may form an angle with respect to a magnetic reference direction associated with resistor 410.

In some implementations, as shown in FIGS. 4A-4C, resistors 410-1, 410-2, and 410-3 may connected to form a first group of resistors 410, while resistors 410-4, 410-5, and 410-6 may connected to form a second group of resistors 410. In some aspects, each group of resistors 410 (e.g., each group of three resistors 410, each half bridge of resistors 410, and/or the like) may be connected to an individual power supply in order to further improve functional safety of angle sensor 200. As shown, each group of resistors 410 may be arranged such that magnetic reference directions of resistors 410 in each group are angularly separated. For example, resistors 410-1, 410-2, and 410-3 may be arranged such that magnetic reference directions of resistors 410-1, 410-2, and 410-3 are angularly separated by approximately 120 degrees. As another example, resistors 410-4, 410-5, and 410-6 may be arranged such that magnetic reference directions of resistors 410-4, 410-5, and 410-6 are angularly separated by approximately 120 degrees. In some implementations, as shown in FIGS. 4A-4C, a group of resistors 410 may be arranged with equal angular separation of the magnetic reference directions of resistors 410 included in the group of resistors 410.

Additionally, or alternatively, a group of resistors 410 may be arranged such that angular separation of the magnetic reference directions of resistors 410 is not equal. For example, a magnetic reference direction of a first resistor 410 may be angularly separated from a magnetic reference direction of a second resistor 410 by a first amount (e.g., 140 degrees), while the magnetic reference direction of the second resistor 410 may be angularly separated from a magnetic reference direction of a third resistor 410 by a second amount (e.g., 100 degrees), and the magnetic reference direction of the third resistor 410 may be angularly separated from a magnetic reference direction of the first resistor 410 by a third amount (e.g., 120 degrees).

In some implementations, a group of resistors 410 may be arranged such that a magnetic reference direction of at least one resistor 410 is non-orthogonal to a magnetic reference direction of each other resistor in the group of resistors. Additionally, or alternatively, a subset of a group of resistors 410 may be arranged such that magnetic reference directions of the subset of resistors 410 are orthogonal. Here, another resistor 410, not included in the subset of resistors 410, may be arranged such that a magnetic reference direction of the other resistor 410 is non-orthogonal to the magnetic reference directions of the subset of resistors 410.

As further shown in FIGS. 4A-4C, a given resistor 410, included in the first group of resistors 410, may be arranged such that the magnetic reference direction of the given resistor 410 opposes (e.g., is angularly separated by approximately 180 degrees) a magnetic reference direction of a corresponding resistor 410 included in the second group of resistors 410. For example, as shown, resistors 410-1 and 410-4 are arranged such that magnetic reference directions of resistors 410-1 and 410-4 are opposing. Similarly, resistors 410-2 and 410-5 are arranged such that magnetic reference directions of resistors 410-2 and 410-5 are opposing. As further shown, resistors 410-3 and 410-6 are arranged such that magnetic reference directions of resistors 410-3 and 410-6 are opposing.

Resistances of resistors 410-1 through 410-6 as function of the angle of rotation are described by the following equations:

$$R_{410\text{-}0} = R \times (O + \cos(\alpha))$$

$$R_{410\text{-}2} = R \times (O + \cos(\alpha + 2\pi/3))$$

$$R_{410\text{-}3} = R \times (O + \cos(\alpha + 4\pi/3))$$

$$R_{410\text{-}4} = R \times (O - \cos(\alpha))$$

$$R_{410\text{-}5} = R \times (O - \cos(\alpha + 2\pi/3))$$

$$R_{410\text{-}6} = R \times (O - \cos(\alpha + 4\pi/3))$$

where R represents a maximum resistance of each resistor 410, and O represents an angular offset associated with positioning of bridge 400.

In some implementations, during operation, bridge 400 may provide multiple output signals associated with components of a magnetic field applied to bridge 400, where at least one component, of the components of the magnetic field, is non-orthogonal to each of the other components of the magnetic field. In some implementations, bridge 400 may provide the multiple output signals based on selectively connecting (i.e., switching) resistors 410 to different voltage terminals during operation of angle sensor 220 in order to form different bridge configurations.

For example, as shown in FIG. 4A, a first bridge configuration may be formed at a first time during operation by connecting resistors 410-1 and 410-4 to a first voltage terminal (e.g., the upper $V_{bias}$ terminal as shown in FIG. 4A) and connecting resistors 410-2, 410-3, 410-5, and 410-6 to a second voltage terminal (e.g., the lower $V_{bias}$ terminal as shown in FIG. 4A). Here, as shown in FIG. 4A, bridge 400 may output a first voltage signal ($V_1$) associated with the first bridge configuration. An amplitude of $V_1$ depends on a resistance of the first bridge configuration. The resistance of the first bridge configuration is described by the following equation:

$$R_1 = \frac{R_p(R_{410-2}, R_{410-3})}{R_{410-1} + R_p(R_{410-2}, R_{410-3})} \frac{R_p(R_{410-5}, R_{410-6})}{R_{410-4} + R_p(R_{410-5}, R_{410-6})}$$

where $R_p(R_{410\text{-}2}, R_{410\text{-}3})$ and $R_p(R_{410\text{-}5}, R_{410\text{-}6})$ represent equivalent resistances of parallel resistors 410-2 and 410-3 and parallel resistors 410-5 and 410-6, respectively, described by the following equations:

$$R_p(R_{410-2}, R_{410-3}) = \frac{R_{410-2} \times R_{410-3}}{R_{410-2} + R_{410-3}}$$

$$R_p(R_{410-5}, R_{410-6}) = \frac{R_{410-5} \times R_{410-6}}{R_{410-5} + R_{410-6}}$$

Continuing with this example, as shown in FIG. 4B, a second bridge configuration may be formed at a second time during operation (e.g., immediately following the first time) by switching connections of resistors 410 such that resistors 410-2 and 410-5 are connected to the first voltage terminal and resistors 410-1, 410-3, 410-4, and 410-6 are connected to the second voltage terminal. Here, as shown in FIG. 4B, bridge 400 may output a second voltage signal ($V_2$) associated with the second bridge configuration. An amplitude of $V_2$ depends on a resistance of the second bridge configuration. The resistance of the second bridge configuration is described by the following equation:

$$R_2 = \frac{R_p(R_{410-3}, R_{410-1})}{R_{410-2} + R_p(R_{410-3}, R_{410-1})} \frac{R_p(R_{410-6}, R_{410-4})}{R_{410-5} + R_p(R_{410-6}, R_{410-4})}$$

where $R_p(R_{410-3}, R_{410-1})$ and $R_p(R_{410-6}, R_{410-4})$ represent equivalent resistances of parallel resistors 410-1 and 410-3 and parallel resistors 410-4 and 410-6, respectively, described by the following equations:

$$R_p(R_{410-3}, R_{410-1}) = \frac{R_{410-3} \times R_{410-1}}{R_{410-3} + R_{410-1}}$$

$$R_p(R_{410-6}, R_{410-4}) = \frac{R_{410-6} \times R_{410-4}}{R_{410-6} + R_{410-4}}$$

Continuing with this example, as shown in FIG. 4C, a third bridge configuration may be formed at a third time during operation (e.g., immediately following the second time) by switching connections of resistors 410 such that resistors 410-3 and 410-6 are connected to the first voltage terminal and resistors 410-1, 410-2, 410-4, and 410-5 are connected to the second voltage terminal. Here, as shown in FIG. 4C, bridge 400 may output a third voltage signal ($V_3$) associated with the third bridge configuration. An amplitude of $V_3$ depends on a resistance of the third bridge configuration. The resistance of the third bridge configuration is described by the following equation:

$$R_3 = \frac{R_p(R_{410-1}, R_{410-2})}{R_{410-3} + R_p(R_{410-1}, R_{410-2})} \frac{R_p(R_{410-4}, R_{410-5})}{R_{410-6} + R_p(R_{410-4}, R_{410-5})}$$

where $R_p(R_{410-1}, R_{410-2})$ and $R_p(R_{410-4}, R_{410-5})$ represent equivalent resistances of parallel resistors 410-1 and 410-2 and parallel resistors 410-4 and 410-5, respectively, described by the following equations:

$$R_p(R_{410-1}, R_{410-2}) = \frac{R_{410-1} \times R_{410-2}}{R_{410-1} + R_{410-2}}$$

$$R_p(R_{410-5}, R_{410-6}) = \frac{R_{410-4} \times R_{410-5}}{R_{410-4} + R_{410-5}}$$

Figure 4D:
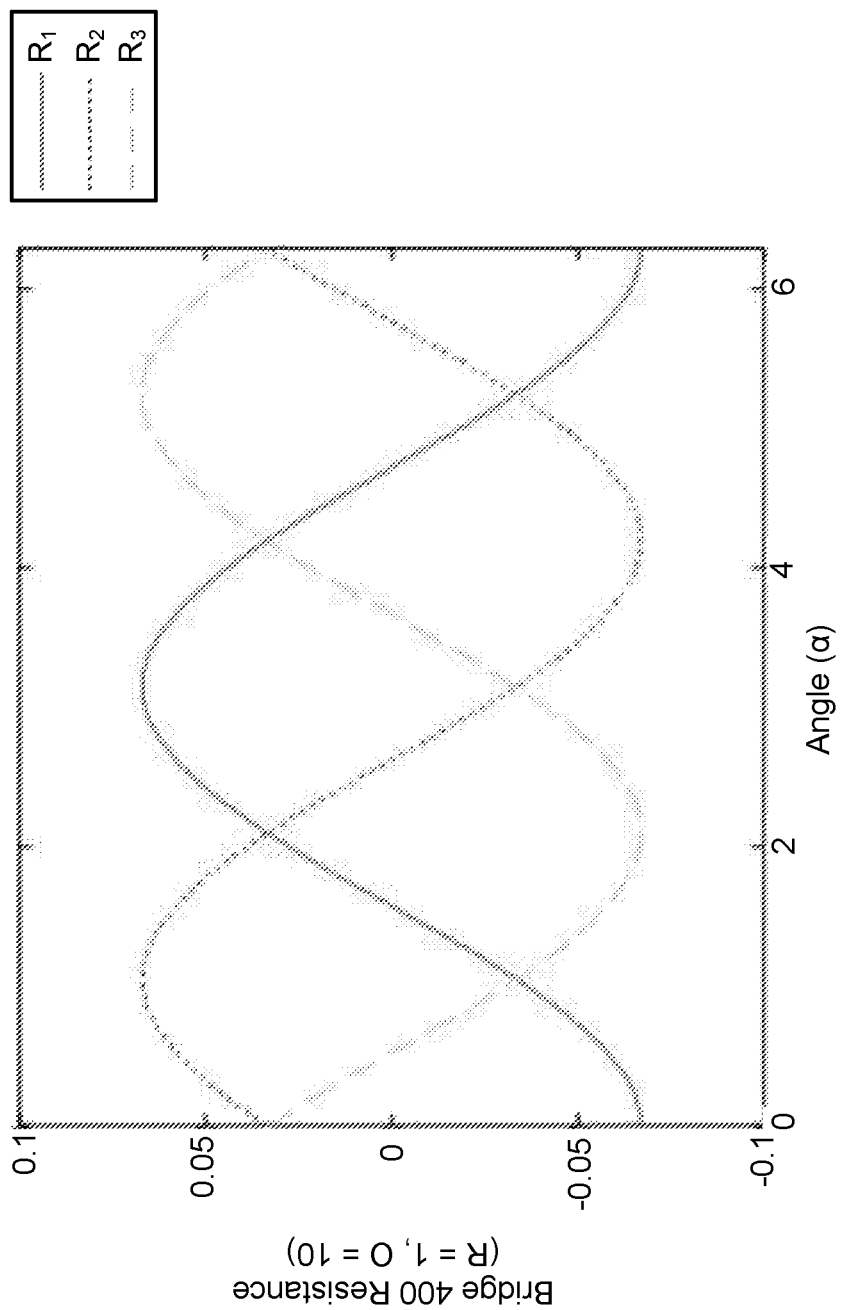

FIG. 4D is a diagram of an example graphical representation showing resistance of each bridge configuration of bridge 400 with respect to the angle of rotation. Notably, as shown in FIG. 4D, for a given angle of rotation, a sum of the resistances corresponding to each bridge configuration is approximately equal to zero (e.g., for a given value of R and O).

Figure 4E:
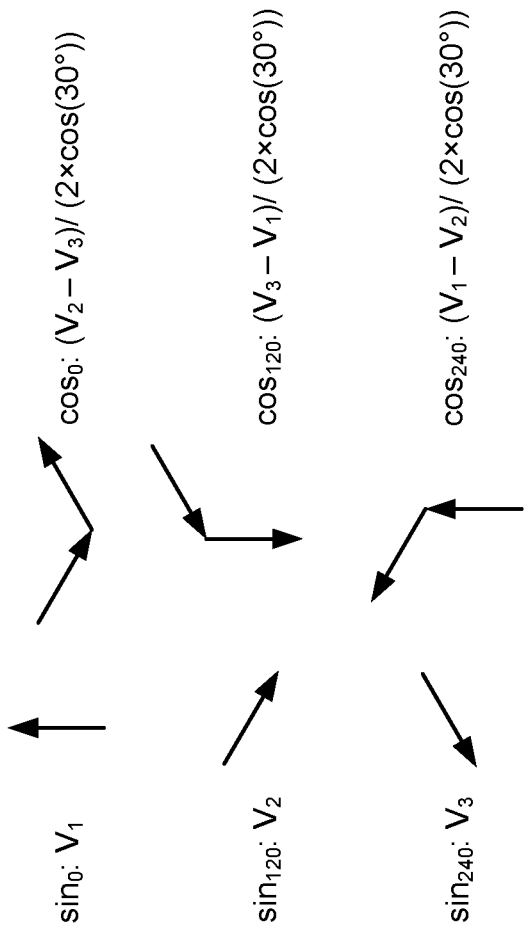

In some implementations, angle sensor 220 may determine the angle of rotation and/or perform one or more improved functional safety checks based on the first voltage signal, the second voltage signal, and the third voltage signal. FIG. 4E shows a diagram associated with determination of the angle of rotation based on the output signals provided by bridge 400. As shown in FIG. 4E, in some implementations, angle sensor 220 may determine the angle of rotation based on reference axes corresponding to magnetic reference directions of resistors 410.

For example, as shown, a sine component of the magnetic field, with respect to a first reference axis (e.g., an axis corresponding to the magnetic reference direction of resistors 410-1 and 410-4), is represented by $V_1$, while a cosine component of the magnetic field, with respect to the first reference axis, is represented by a combination of $V_2$ and $V_3$ (e.g., $(V_2-V_3)/(2\times\cos(30°))$). Similarly, a sine component of the magnetic field, with respect to a second reference axis (e.g., an axis corresponding to the magnetic reference direction of resistors 410-2 and 410-5, representing a 120° clockwise rotation from the first reference axis), is represented by $V_2$, while a cosine component of the magnetic field, with respect to the second reference axis, is represented by a combination of $V_3$ and $V_1$ (e.g., $(V_3-V_1)/(2\times\cos(30°))$). Further, in this example, a sine component of the magnetic field, with respect to a third reference axis (e.g., an axis corresponding to the magnetic reference direction of resistors 410-3 and 410-6, representing a 240° clockwise rotation from the first reference axis), is represented by $V_3$, while a cosine component of the magnetic field, with respect to the third reference axis, is represented by a combination of $V_1$ and $V_2$ (e.g., $(V_1-V_2)/(2\times\cos(30°))$).

As further shown in FIG. 4E, angle sensor 220 may determine the angle of rotation based on the sine components and the cosine components associated with each reference axis (e.g., based on inverse tangents of each sine component divided by a corresponding cosine component, and correcting for the rotation of the reference axis).

In some implementations, angle sensor 220 may perform one or more improved functional safety checks using the output signals and/or the determined angle of rotation. For example, since a sum of resistances of each bridge configuration should be approximately equal to zero for a given angle of rotation (as shown above with regard to FIG. 4D), a sum of the output signals should also be approximately equal to zero (e.g., $V_1+V_2+V_3=0$). Here, angle sensor 220 may determine whether the sum of the output signals is approximately equal to zero (e.g., within a threshold amount, such as 0.1 volts, 0.05 volts, or the like). If so, then safe operation of angle sensor 220 may be assumed. Conversely, if the sum of the output signals is not approximately equal to zero (e.g., differs from zero by an amount equal to or greater than the threshold amount), then angle sensor 220 may determine that one or more elements of bridge 400 are not operating properly, and may act accordingly (e.g., send a warning message and/or notification to controller 230, raise an error flag, disable bridge 400, or the like).

As another example, the arrangement of bridge 400 should result in a vector sum of the output signals being substantially constant during operation (e.g., $V_1^2+V_2^2+V_3^2=\text{constant}$). Here, angle sensor 220 may determine whether the vector sum of the output signals is substantially constant (e.g., whether the vector sum varies at a rate that satisfies threshold). If so, then safe operation of angle sensor 220 may be assumed. Conversely, if the vector sum of the output signals is not substantially constant (e.g., varying at a rate that is greater than the threshold), then angle sensor 220 may determine that one or more elements of bridge 400 are not operating properly, and may act accordingly (e.g., send a warning message to controller 230, raise an error flag, disable bridge 400, or the like).

As another example, the arrangement of bridge 400 should result in each determined angle of rotation (e.g., $\alpha_1$, $\alpha_2$, and $\alpha_3$ in FIG. 4E) substantially matching. Here, angle sensor 220 may determine whether each determined angle of rotation substantially matches (e.g., whether differences between each of $\alpha_1$, $\alpha_2$, and $\alpha_3$ are less than or equal to a threshold difference, such as 0.1 degrees, 0.5 degrees, or the like). If so, then safe operation of angle sensor 220 may be assumed. Conversely, if the determined angles of rotation do not substantially match (e.g., if a difference greater than the threshold), then angle sensor 220 may determine that one or more elements of bridge 400 are not operating properly, and may act accordingly (e.g., send a warning message and/or notification to controller 230, raise an error flag, disable bridge 400, or the like).

In some implementations, when two or more determined angles of rotation substantially match, and a third determined angle does not, then angle sensor 220 may identify which determined angle of rotation does not match, and act accordingly. For example, if $\alpha_1$ substantially matches $\alpha_2$, and $\alpha_3$ does not substantially match $\alpha_1$ or $\alpha_2$, then angle sensor 220 may continue determining $\alpha_1$ or $\alpha_2$, discontinue determining $\alpha_3$, and send a warning message and/or notification, raise an error flag, or the like, regarding a possible error or malfunction associated with determining $\alpha_3$.

In some implementations, angle sensor 220 may perform one or more functional safety checks before determining the angle of rotation in order to conserve processing resources, reduce power consumption, or the like. For example, angle sensor 220 may determine whether the sum of the output signals is approximately equal to zero before determining the angle(s) of rotation. Here, if the sum of the output signals is not approximately equal to zero, as described above, then angle sensor 220 may refrain from determining the angle of rotation (e.g., since safe operation may not be assumed), thereby conserving processing resources, reducing power consumption, or the like.

In this way, angle sensor 220 may provide output signals associated with three or more components of a magnetic field, where at least one of the three or more components of the magnetic field is non-orthogonal to each other component of the magnetic field. The output signals, associated with the multiple components, may be used to determine the angle of rotation, and may allow for improved and/or additional functional safety checks, increased reliability, diversity, and/or redundancy (e.g., as compared to an angle sensor without the sensing element of angle sensor 220). Moreover, the sensing element of angle sensor 220 includes only six resistors 410, thereby reducing cost and/or complexity of angle sensor 220 while providing improved functional safety.

The number and arrangement of resistors 410 shown in FIGS. 4A-4C, and the examples shown in FIGS. 4D and 4E are provided merely as examples. In practice, sensing element 310 may include additional resistors 410, fewer resistors 410, different resistors 410, or differently arranged resistors 410 than those shown in FIGS. 4A-4C. Additionally, angular separations, orientations of magnetic reference directions, equations for determining the angle of rotation, resistance values, or the like, associated with FIGS. 4A-4E are provided merely as examples, and other examples are possible.

Figure 5A:
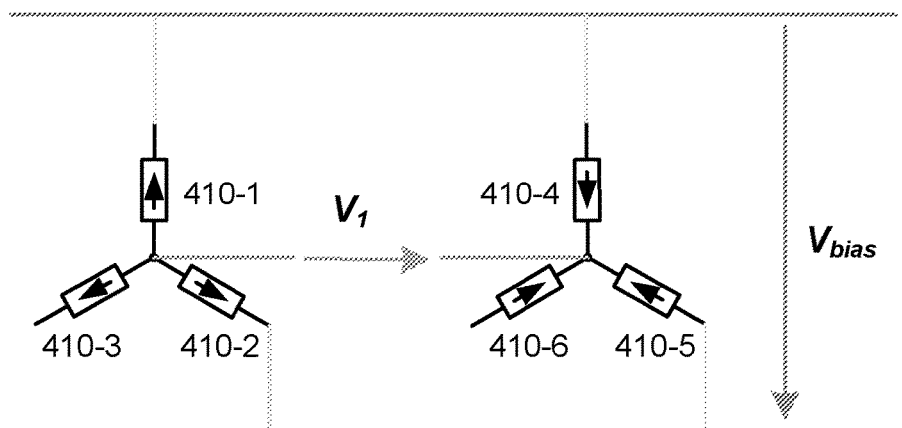
FIGS. 5A-5D are diagrams associated with another example implementation of a sensing element included in the angle sensor of FIG. 2.
Figure 5B:
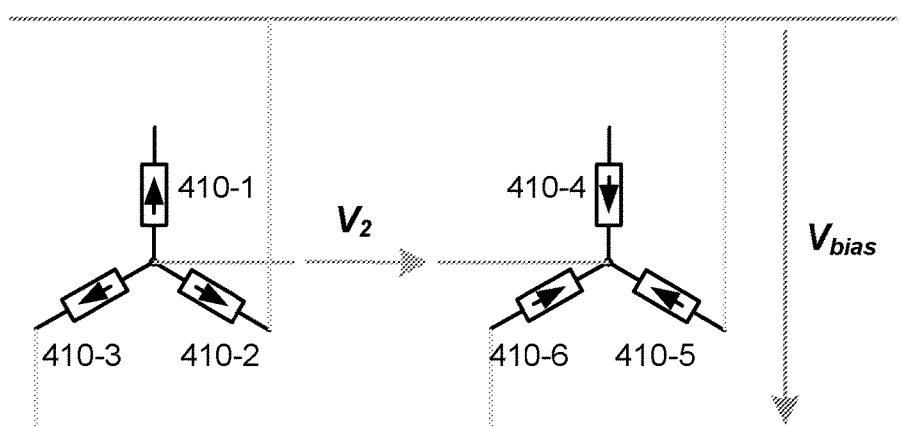
Figure 5C:
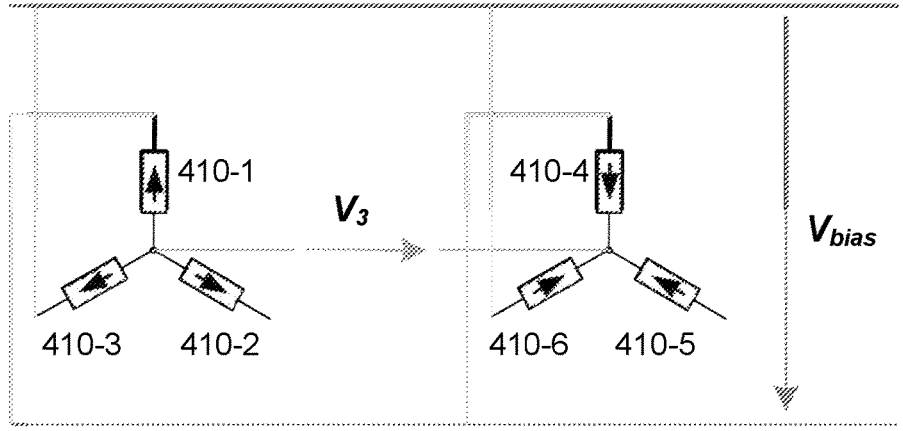

FIGS. 5A-5D are diagrams associated with another example implementation of sensing element 310 included in angle sensor 220. FIGS. 5A-5C show an example bridge 500 of sensing elements 310 in angle sensor 220. As shown in FIGS. 5A-5C, in some implementations, bridge 500 may include resistors 410-1 through 410-6. Bridge 500 and resistors 410 may be arranged in a manner similar to that described above with regard to bridge 400.

In some implementations, during operation, bridge 500 may provide multiple output signals associated with components of a magnetic field applied to bridge 500, where at least one component, of the components of the magnetic field, is non-orthogonal to each of the other components of the magnetic field. In some implementations, bridge 500 may provide the multiple output signals based on selectively connecting (i.e., switching) resistors 410 to different voltage terminals during operation of angle sensor 220 in order to form different bridge configurations or disconnecting resistors 410 from all voltage terminals during operation.

For example, as shown in FIG. 5A, a first bridge configuration may be formed at a first time during operation by connecting resistors 410-1 and 410-4 to a first voltage terminal (e.g., the upper $V_{bias}$ terminal as shown in FIG. 5A), connecting resistors 410-2 and 410-5 to a second voltage terminal (e.g., the lower $V_{bias}$ terminal as shown in FIG. 5A), and disconnecting resistors 410-3 and 410-6 from both voltage terminals. Here, as shown in FIG. 5A, bridge 500 may output a first voltage signal ($V_1$) associated with the first bridge configuration. An amplitude of $V_1$ depends on a resistance of the first bridge configuration. The resistance of the first bridge configuration is described by the following equation:

$$R_1 = \frac{R_{410-2}}{R_{410-1} + R_{410-2}} \frac{R_{410-5}}{R_{410-4} + R_{410-5}}$$

Continuing with this example, as shown in FIG. 5B, a second bridge configuration may be formed at a second time during operation (e.g., immediately following the first time) by connecting resistors 410-2 and 410-5 to the first voltage terminal, connecting resistors 410-3 and 410-6 to the second voltage terminal, and disconnecting resistors 410-1 and 410-4 from both voltage terminals. Here, as shown in FIG. 5B, bridge 500 may output a second voltage signal ($V_2$) associated with the second bridge configuration. An amplitude of $V_2$ depends on a resistance of the second bridge configuration. The resistance of the second bridge configuration is described by the following equation:

$$R_2 = \frac{R_{410-3}}{R_{410-2} + R_{410-3}} \frac{R_{410-6}}{R_{410-5} + R_{410-6}}$$

Continuing with this example, as shown in FIG. 5C, a third bridge configuration may be formed at a third time during operation (e.g., immediately following the second time) by connecting resistors 410-3 and 410-6 to the first voltage terminal, connecting resistors 410-1 and 410-4 to the second voltage terminal, and disconnecting resistors 410-2 and 410-5 from both voltage terminals. Here, as shown in FIG. 5C, bridge 500 may output a third voltage signal ($V_3$) associated with the third bridge configuration. An amplitude of $V_3$ depends on a resistance of the third bridge configuration. The resistance of the third bridge configuration is described by the following equation:

$$R_3 = \frac{R_{410-1}}{R_{410-3} + R_{410-1}} \frac{R_{410-4}}{R_{410-6} + R_{410-4}}$$

Figure 5D:
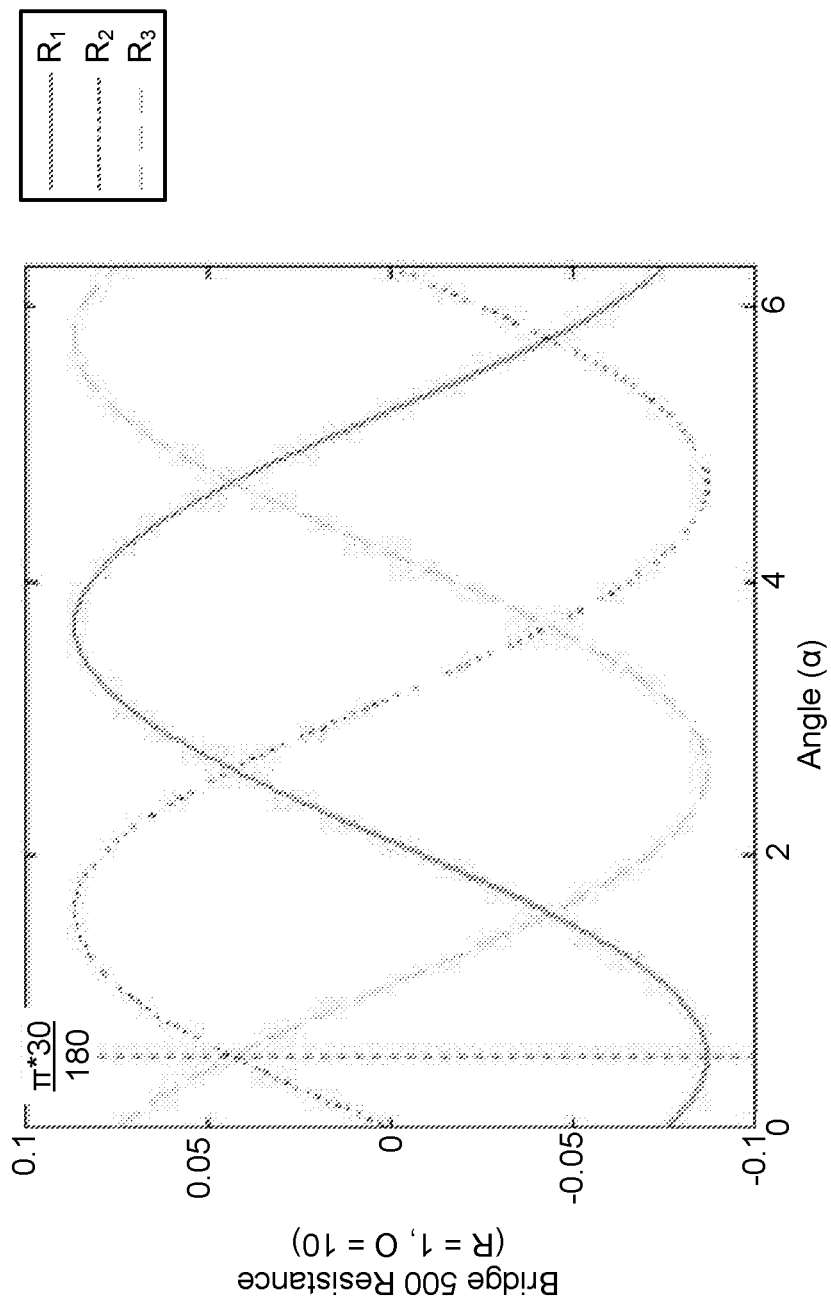

FIG. 5D is a diagram of an example graphical representation showing resistance of each bridge configuration of bridge 500 with respect to the angle of rotation. Notably, as shown in FIG. 5D, for a given angle of rotation, a sum the resistances corresponding to each bridge configuration is approximately equal to zero (e.g., for a given value of R and O).

In some implementations, angle sensor 220 may determine the angle of rotation based on the first voltage signal, the second voltage signal, and the third voltage signal. For example, angle sensor 220 may determine the angle of rotation based on the following equations (similar to those described in association with FIG. 4E, and accounting for a 30° shifted angle axis):

$$\alpha_1 = \arctan[2 \times \cos(30°)/V_1/(V_2-V_3)]-30°$$

$$\alpha_2 = \arctan[2 \times \cos(30°) \times V_2/(V_3-V_1)]-150°$$

$$\alpha_3 = \arctan[2 \times \cos(30°) \times V_3/(V_1-V_2)]-270°$$

In some implementations, angle sensor 220 may perform one or more improved functional safety checks associated with bridge 500, in a manner similar to that described above with regard to bridge 400.

The number and arrangement of resistors 510 shown in FIGS. 5A-5C, and the example shown in FIG. 5D are provided merely as examples. In practice, sensing element 310 may include additional resistors 410, fewer resistors 410, different resistors 410, or differently arranged resistors 410 than those shown in FIGS. 5A-5C. Additionally, angular separations, orientations of magnetic reference directions, equations for determining the angle of rotation, resistance values, or the like, associated with FIGS. 5A-SD are provided merely as examples, and other examples are possible.

Figure 6A:
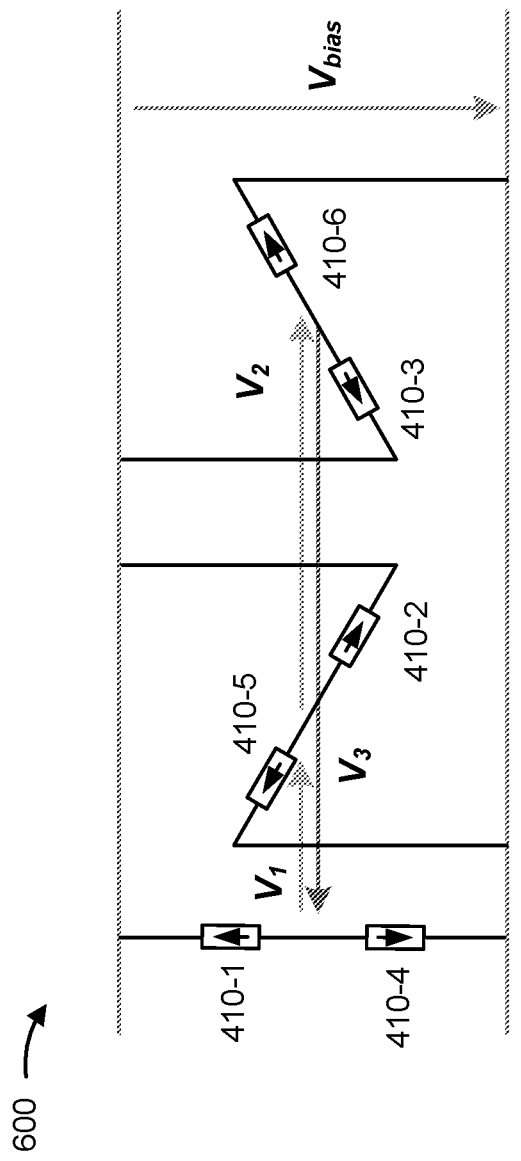
FIGS. 6A and 6B are diagrams associated with an additional example implementation of a sensing element included in the angle sensor of FIG. 2.
Figure 6B:
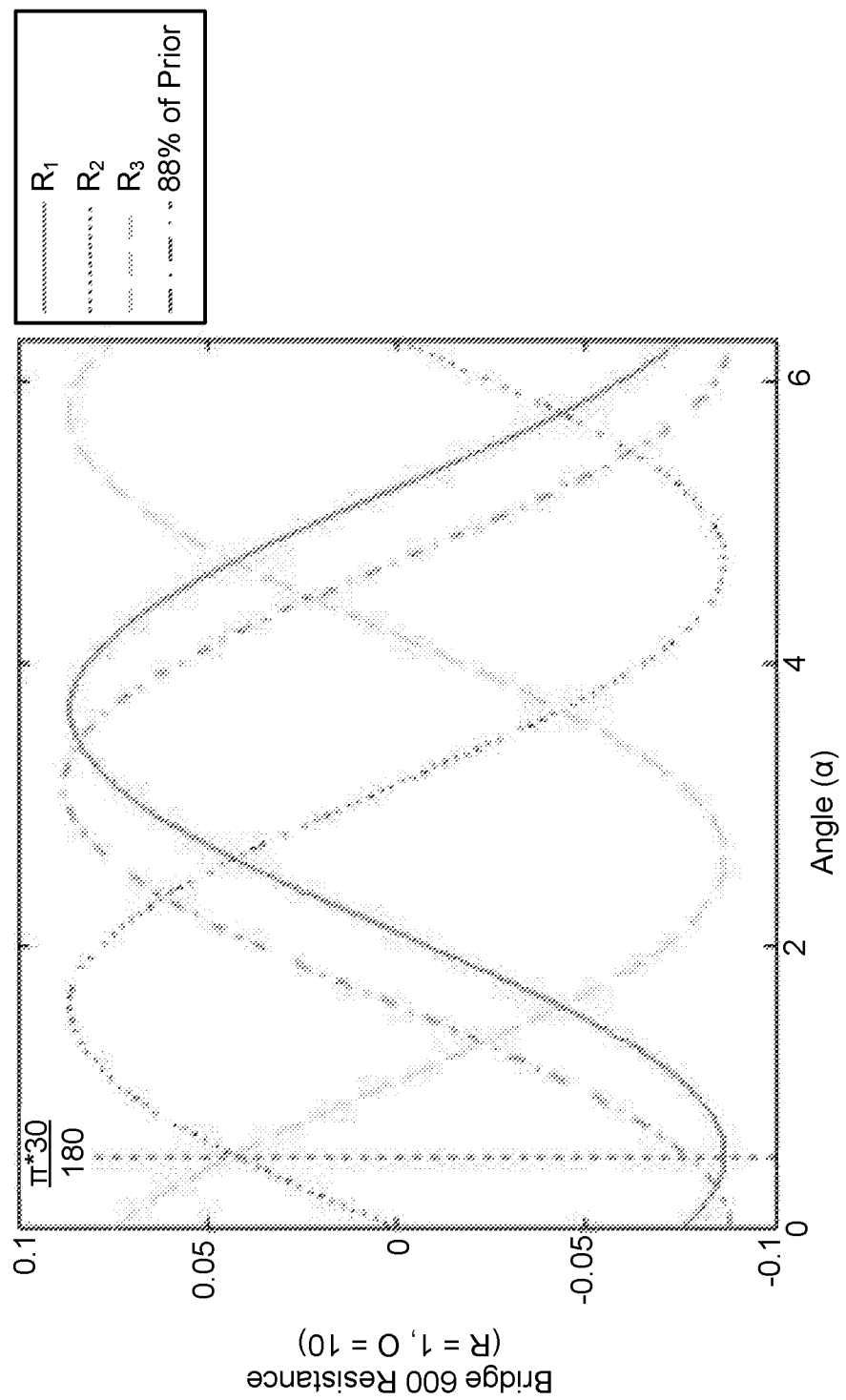

FIGS. 6A and 6B are diagrams associated with an additional example implementation of sensing element 310 included in angle sensor 220. FIG. 6A shows an example bridge 600 of sensing element 310 in angle sensor 220. As shown in FIG. 6, in some implementations, bridge 600 may include resistors 410-1 through 410-6.

In some implementations, as shown in FIG. 6A, resistors 410-1 through 410-6 may be arranged to form three non-orthogonal half bridges. For example, resistor 410-1 and 410-4 may be arranged to form a first half bridge associated with a first reference axis (e.g., a 0° angle with respect to a vertical direction of FIG. 6B), resistor 410-2 and 410-5 may be arranged to form a second half bridge associated with a second reference axis (e.g., a 120° clockwise angle of rotation with respect to a vertical direction of FIG. 6B), and resistor 410-3 and 410-6 may be arranged to form a third half bridge associated with a third reference axis (e.g., a 240° clockwise angle of rotation with respect to a vertical direction of FIG. 6B). As shown, in some implementations, the first, second, and third half bridges may be connected to the first and second voltage terminals. In some implementations, the first, second, and third half bridges may be permanently connected to the first and second voltage terminals.

In some implementations, during operation, bridge 600 may concurrently provide multiple output signals associated with components of a magnetic field applied to bridge 600, where at least one component, of the components of the magnetic field, is non-orthogonal to each of the other components of the magnetic field. For example, as shown in FIG. 6A, bridge 600 may output a first voltage signal ($V_1$) associated with voltage between the first half bridge and the second half bridge. An amplitude of $V_1$ depends on an equivalent resistance of the first half bridge and the second half bridge. The equivalent resistance of the first half bridge and the second half bridge is described by the following equation:

$$R_1 = \frac{R_{410-4}}{R_{410-1}+R_{410-4}} \frac{R_{410-5}}{R_{410-2}+R_{410-5}}$$

Continuing with this example, bridge 600 may output a second voltage signal ($V_2$) associated with voltage between the second half bridge and the third half bridge. An amplitude of $V_2$ depends on an equivalent resistance of the second half bridge and the third half bridge. The equivalent resistance of the second half bridge and the third half bridge is described by the following equation:

$$R_2 = \frac{R_{410-5}}{R_{410-2}+R_{410-5}} \frac{R_{410-6}}{R_{410-3}+R_{410-6}}$$

Continuing with this example, bridge 600 may output a third voltage signal ($V_3$) associated with voltage between the third half bridge and the first half bridge. An amplitude of $V_3$ depends on an equivalent resistance of the third half bridge and the first half bridge. The equivalent resistance of the third half bridge and the first half bridge is described by the following equation:

$$R_3 = \frac{R_{410-6}}{R_{410-3}+R_{410-6}} \frac{R_{410-4}}{R_{410-1}+R_{410-4}}$$

FIG. 6B is a diagram of an example graphical representation showing equivalent resistances of bridge 600 with respect to the angle of rotation. Notably, as shown in FIG. 6B, for a given angle of rotation, a sum the resistances corresponding to each bridge configuration is approximately equal to zero (e.g., for a given value of R and O). In some implementations, bridge 600 may have a reduced area consumption with a slight reduction in signal amplitude as compared to a prior angle sensor. For example, bridge 600 may reduce area consumption by approximately 50% as compared to a prior angle sensor with similar capabilities (e.g., a prior angle sensor with three full Wheatstone bridges), with an amplitude reduction of approximately 12%, as illustrated in FIG. 6B (e.g., by the line labeled "88% of Prior").

In some implementations, angle sensor 220 may determine the angle of rotation based on the first voltage signal, the second voltage signal, and the third voltage signal, in a manner similar to the described above with regard to bridge 400. Additionally, or alternatively, angle sensor 220 may perform one or more improved functional safety checks associated with bridge 600, in a manner similar to that described above with regard to bridge 400.

The number and arrangement of resistors 410 shown in FIG. 6A, and the example shown in FIG. 6B are provided merely as examples. In practice, sensing element 310 may include additional resistors 410, fewer resistors 410, different resistors 410, or differently arranged resistors 410 than those shown in FIG. 6A. Additionally, angular separations, orientations of magnetic reference directions, equations for determining the angle of rotation, resistance values, or the like, associated with FIGS. 6A and 6B are provided merely as examples, and other examples are possible.

Figure 7:
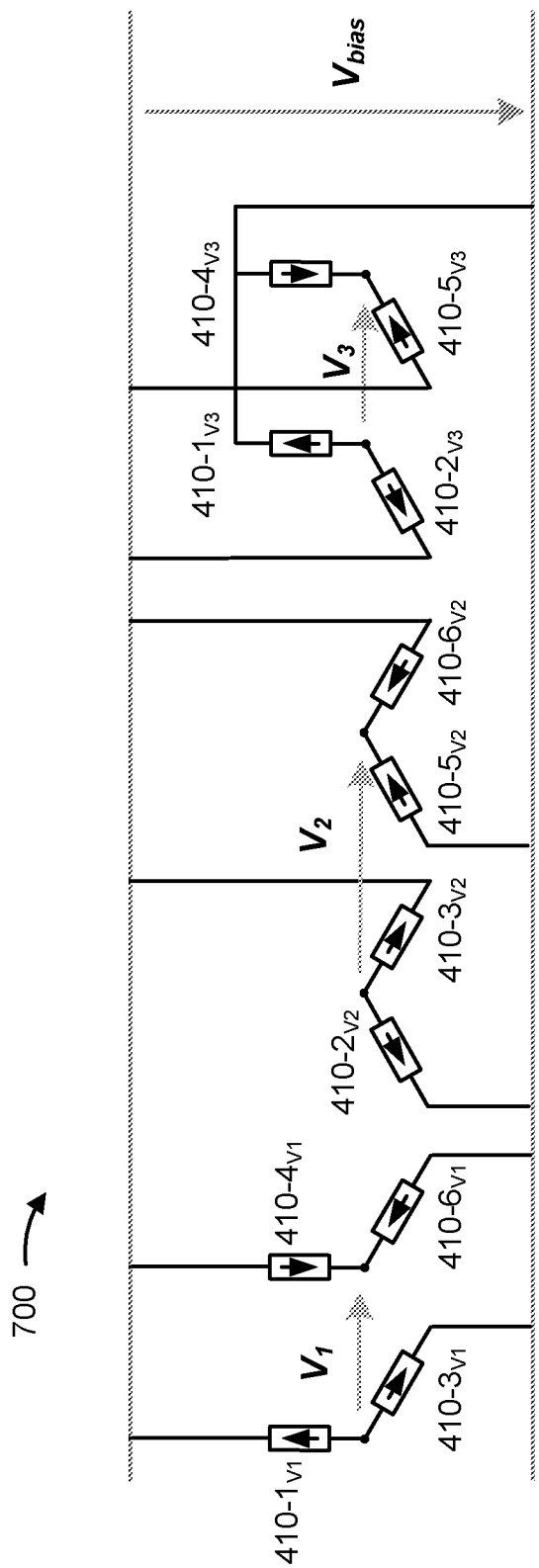
FIG. 7 is a diagram associated with another example implementation of a sensing element included in the angle sensor of FIG. 2.

FIG. 7 is a diagram associated with another example implementation of sensing element 310 included in angle sensor 220. FIG. 7 shows an example bridge 700 of sensing element 310 in angle sensor 220. As shown in FIG. 7, in some implementations, bridge 700 may include two of each of resistors 410-1 through 410-6.

In some implementations, bridge 700 may operate a manner similar to that of bridge 600 of FIG. 6. In some implementations, inclusion of additional resistors 410 in bridge 700 may provide for increased reliability and/or redundancy.

The number and arrangement of resistors 410 shown in FIG. 7 are provided merely as an example. In practice, sensing element 310 may include additional resistors 410, fewer resistors 410, different resistors 410, or differently arranged resistors 410 than those shown in FIG. 7. Additionally, angular separations, orientations of magnetic reference directions, equations for determining the angle of rotation, resistance values, or the like, associated with FIG. 7 are provided merely as examples, and other examples are possible.

Figure 8:
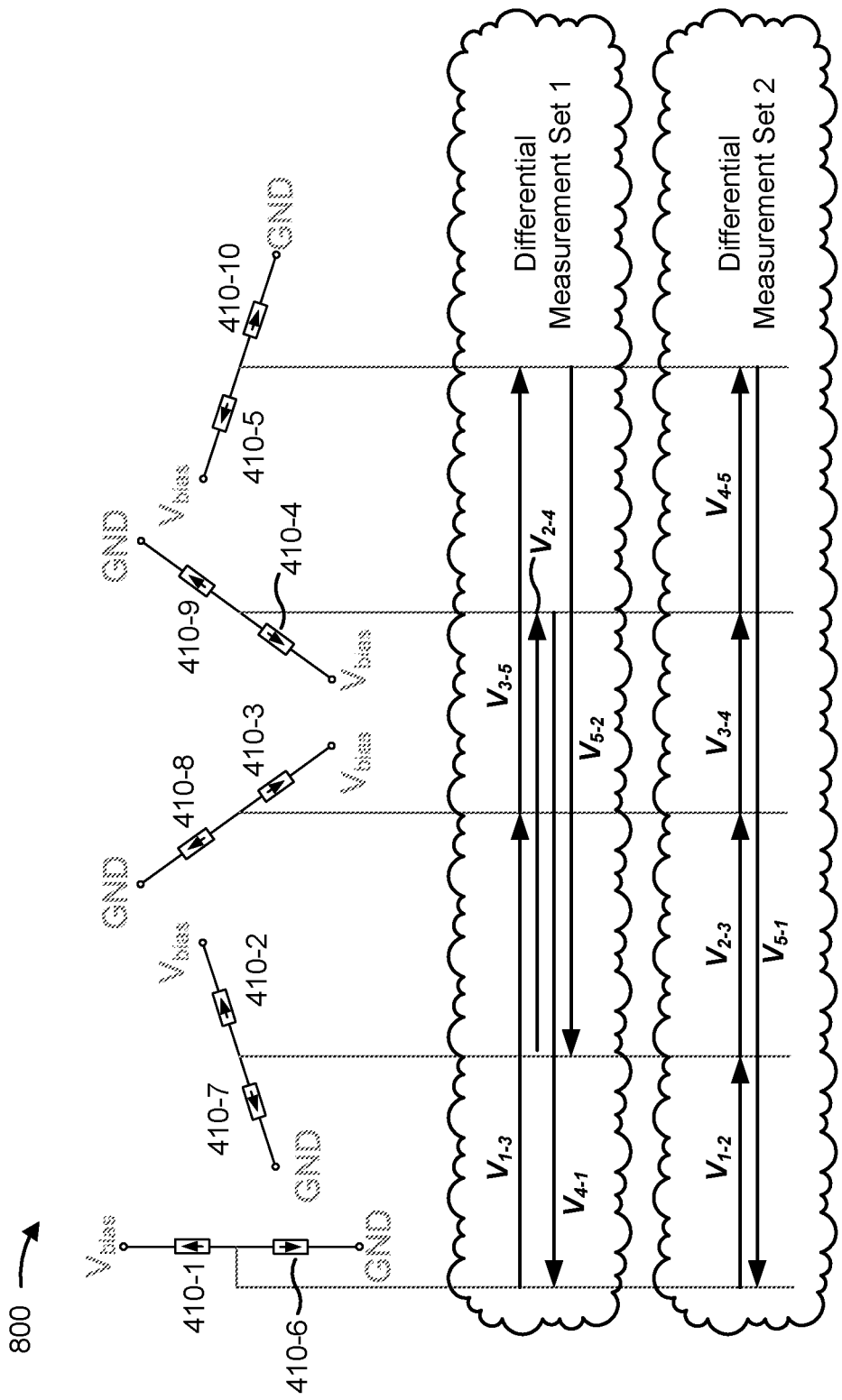
FIG. 8 is a diagram associated with another example implementation of a sensing element included in the angle sensor of FIG. 2.

FIG. 8 is a diagram associated with an additional example implementation of sensing element 310 included in angle sensor 220. FIG. 8 shows an example bridge 800 of sensing element 310 in angle sensor 220. As shown in FIG. 8, in some implementations, bridge 800 may include resistors 410-1 through 410-10.

In some implementations, as shown in FIG. 8, resistors 410-1 through 410-10 may be arranged to form five non-orthogonal half bridges. For example, resistor 410-1 and 410-6 may be arranged to form a first half bridge associated with a first reference axis (e.g., a 0° angle with respect to a vertical direction of FIG. 8), resistor 410-2 and 410-7 may be arranged to form a second half bridge associated with a second reference axis (e.g., a 72° clockwise angle of rotation with respect to a vertical direction of FIG. 8), resistor 410-3 and 410-8 may be arranged to form a third half bridge associated with a third reference axis (e.g., a 144° clockwise angle of rotation with respect to a vertical direction of FIG. 8), resistor 410-4 and 410-9 may be arranged to form a fourth half bridge associated with a fourth reference axis (e.g., a 216° clockwise angle of rotation with respect to a vertical direction of FIG. 8), and resistor 410-5 and 410-10 may be arranged to form a fifth half bridge associated with a fifth reference axis (e.g., a 288° clockwise angle of rotation with respect to a vertical direction of FIG. 8). In some implementations, the first, second, third, fourth, and fifth half bridges may be connected to a respective voltage terminals. In some implementations, the first, second, third, fourth, and fifth half bridges may be permanently and/or directly connected to the first and second voltage terminals.

In some implementations, during operation, bridge 800 may concurrently provide multiple output signals associated with components of a magnetic field applied to bridge 800, where at least one component, of the components of the magnetic field, is non-orthogonal to each of the other components of the magnetic field.

For example, in a first implementation shown in FIG. 8 (labeled as differential measurement set 1 in FIG. 8), bridge 800 may output a first voltage signal ($V_{1-3}$) associated with voltage between the first half bridge and the third half bridge, an amplitude of which depends on an equivalent resistance of the first half bridge and the third half bridge. As further shown, bridge 800 may output a second voltage signal ($V_{3-5}$) associated with the voltage between the third half bridge and the fifth half bridge, an amplitude of which depends on an equivalent resistance of the third half bridge and the fifth half bridge. As further shown, bridge 800 may output a third voltage signal ($V_{2-4}$) associated with the voltage between the second half bridge and the fourth half bridge, an amplitude of which depends on an equivalent resistance of the second half bridge and the fourth half bridge. As further shown, bridge 800 may output a fourth voltage signal ($V_{4-1}$) associated with the voltage between the fourth half bridge and the first half bridge, an amplitude of which depends on an equivalent resistance of the fourth half bridge and the first half bridge. As further shown, bridge 800 may output a fifth voltage signal ($V_{5-2}$) associated with the voltage between the fifth half bridge and the second half bridge, an amplitude of which depends on an equivalent resistance of the fifth half bridge and the second half bridge.

As another example, in a second implementation shown in FIG. 8 (labeled as differential measurement set 2 in FIG. 8), bridge 800 may output a first voltage signal ($V_{1-2}$) associated with voltage between the first half bridge and the second half bridge, an amplitude of which depends on an equivalent resistance of the first half bridge and the second half bridge. As further shown, bridge 800 may output a second voltage signal ($V_{2-3}$) associated with the voltage between the second half bridge and the third half bridge, an amplitude of which depends on an equivalent resistance of the second half bridge and the third half bridge. As further shown, bridge 800 may output a third voltage signal ($V_{3-4}$) associated with the voltage between the third half bridge and the fourth half bridge, an amplitude of which depends on an equivalent resistance of the third half bridge and the fourth half bridge. As further shown, bridge 800 may output a fourth voltage signal ($V_{4-5}$) associated with the voltage between the fourth half bridge and the fifth half bridge, an amplitude of which depends on an equivalent resistance of the fourth half bridge and the fifth half bridge. As further shown, bridge 800 may output a fifth voltage signal ($V_{5-1}$) associated with the voltage between the fifth half bridge and the first half bridge, an amplitude of which depends on an equivalent resistance of the fifth half bridge and the first half bridge.

In the above examples, angle sensor 220 may determine the angle of rotation based on the first voltage signal, the second voltage signal, the third voltage signal, the fourth voltage signal, and the fifth voltage signal, in a manner similar to the described above. Additionally, or alternatively, angle sensor 220 may perform one or more improved functional safety checks associated with bridge 800, in a manner similar to that described above. For example, since a sum of resistances of each bridge configuration should be approximately equal to zero for a given angle of rotation, a sum of the output signals should also be approximately equal to zero (e.g., $V_{1-3}+V_{3-5}+V_{2-4}+V_{4-1}+V_{5-2}=0$ for differential measurement set 1, or $V_{1-2}+V_{2-3}+V_{3-4}+V_{4-5}+V_{5-1}=0$ for differential measurement set 2). Here, angle sensor 220 may determine whether the sum of the output signals is approximately equal to zero (e.g., within a threshold amount, such as 0.1 volts, 0.05 volts, or the like). If so, then safe operation of angle sensor 220 may be assumed. Conversely, if the sum of the output signals is not approximately equal to zero (e.g., differs from zero by an amount equal to or greater than the threshold amount), then angle sensor 220 may determine that one or more elements of bridge 800 are not operating properly, and may act accordingly (e.g., send a warning message and/or notification to controller 230, raise an error flag, disable bridge 800, or the like).

As another example, the arrangement of bridge 800 should result in a vector sum of the output signals being substantially constant during operation (e.g., $V_{1-3}^2+V_{3-5}^2+V_{2-4}^2+V_{4-1}^2+V_{5-2}^2$=constant for differential measurement set 1, or $V_{1-2}^2+V_{2-3}^2+V_{3-4}^2+V_{4-5}^2+V_{5-1}^2$=constant for differential measurement set 2). Here, angle sensor 220 may determine whether the vector sum of the output signals is substantially constant. If so, then safe operation of angle sensor 220 may be assumed. Conversely, if the vector sum of the output signals is not substantially constant (e.g., varying at a rate that is greater than the threshold), then angle sensor 220 may determine that one or more elements of bridge 800 are not operating properly, and may act accordingly (e.g., send a warning message to controller 230, raise an error flag, disable bridge 800, or the like).

The number and arrangement of resistors 410 shown in FIG. 8 are provided merely as examples. In practice, sensing element 310 may include additional resistors 410, fewer resistors 410, different resistors 410, or differently arranged resistors 410 than those shown in FIG. 8. Additionally, angular separations, orientations of magnetic reference directions, equations for determining the angle of rotation, resistance values, or the like, associated with FIG. 8 are provided merely as examples, and other examples are possible.

Implementations described herein provide an angle sensor with a sensing element that provides output signals associated with multiple (e.g., three or more) components of a magnetic field, where at least one of the multiple components of the magnetic field is non-orthogonal to each other of the multiple components of the magnetic field. The output signals, associated with the multiple components, may be used to determine the angle of rotation, and may allow for improved and/or additional functional safety checks, increased reliability, diversity, and/or redundancy (e.g., as compared to an angle sensor without such a sensing element). Moreover, the sensing element of the angle sensor includes fewer elements (e.g., resistors, connections, or the like) than a prior angle sensor, thereby reducing cost and/or complexity of the angle sensor while providing improved functional safety.

The foregoing disclosure provides illustration and description, but is not intended to be exhaustive or to limit the implementations to the precise form disclosed. Modifications and variations are possible in light of the above disclosure or may be acquired from practice of the implementations. For example, while the implementations described herein are described in the context of three reference axes and five reference axes, in practice another number of reference axes may be utilized.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An apparatus, comprising:
    a sensing element to:
        provide a first voltage signal, a second voltage signal, and a third voltage signal,
            the sensing element including a set of magnetoresistive (MR) elements arranged with respect to a first reference axis, a second reference axis, and a third reference axis,
            the set of MR elements including a first half bridge associated with the first reference axis, a second half bridge associated with the second reference axis, and a third half bridge associated with the third reference axis, and
            at least one MR element, of the set of MR elements, being non-orthogonal to each other MR element of the set of MR elements; and
    a processor to:
        receive the first voltage signal, the second voltage signal, and the third voltage signal; and
        determine, based on the first voltage signal, the second voltage signal, and the third voltage signal, an angle of rotation of a magnetic field applied to the sensing element.

2. The apparatus of claim 1, where the set of MR elements includes at least six MR elements.

3. The apparatus of claim 1, where the first half bridge, the second half bridge, and the third half bridge are directly connected to voltage terminals associated with a bias voltage.

4. The apparatus of claim 1, where the processor is further to:
    determine a sum of a first amplitude of the first voltage signal, a second amplitude of the second voltage signal, and a third amplitude of the third voltage signal; and
    perform a functional safety check, associated with the apparatus, based on the first amplitude, the second amplitude, and the third amplitude.

5. The apparatus of claim 1, where the processor is further to:
    determine a vector sum of a square of a first amplitude of the first voltage signal, a square of a second amplitude of the second voltage signal, and a square of a third amplitude of the third voltage signal; and
    perform a functional safety check, associated with the apparatus, based on the vector sum.

6. The apparatus of claim 1, where the angle of rotation is a first angle of rotation, and
    where the processor is further to:
        determine a second angle of rotation based on the first voltage signal, the second voltage signal, and the third voltage signal;
        determine a third angle of rotation based on the first voltage signal, the second voltage signal, and the third voltage signal; and
        perform a functional safety check, associated with the apparatus, based on the first angle of rotation, the second angle of rotation, and the third angle of rotation.

7. The apparatus of claim 1, wherein the processor is further to:
determine whether a sum of the first voltage signal, the second voltage signal, and the third voltage signal is zero; and
wherein the processor, when determining the angle of rotation, is to:
determine, based on the sum being zero, the angle of rotation.

8. The apparatus of claim 1, wherein the processor is further to:
determine whether a first vector sum of the first voltage signal, the second voltage signal, and the third voltage signal at a first time is zero;
determine whether a second vector sum of the first voltage signal, the second voltage signal, and the third voltage signal at a second time is zero; and
determine safe operation of the apparatus based on determining that the first vector sum is zero and determining that the second vector sum is zero.

9. The apparatus of claim 1, wherein the processor is further to:
determine whether a varying rate of a vector sum of the first voltage signal, the second voltage signal, and the third voltage signal satisfies a threshold rate; and
determine safe operation of the apparatus based on determining that the varying rate of the vector sum is less than the threshold rate.

10. The apparatus of claim 1, wherein the processor is further to:
determine whether a varying rate of a vector sum of the first voltage signal, the second voltage signal, and the third voltage signal satisfies a threshold rate; and
perform one or more actions based on determining that varying rate of the vector sum varies satisfies the threshold rate,
the one or more actions including:
sending a warning message,
raising an error flag, or
disabling a bridge associated with the sensing element.

11. A magnetic sensor, comprising:
a sensing element to provide a first output signal, a second output signal, and a third output signal,
the sensing element including:
at least two magnetoresistive (MR) elements with magnetic reference directions along a first reference axis,
at least two MR elements with magnetic reference directions along a second reference axis, and
at least two MR elements with magnetic reference directions along a third reference axis,
where at least one of the first reference axis, the second reference axis, or the third reference axis is non-orthogonal to each other reference axis of the first reference axis, the second reference axis, and the third reference axis; and
a processor to perform a functional safety check, associated with the magnetic sensor, based on the first output signal, the second output signal, and the third output signal.

12. The magnetic sensor of claim 11, wherein the at least two MR elements with magnetic reference directions along the first reference axis are arranged to form a first half bridge;
wherein the at least two MR elements with magnetic reference directions along the second reference axis are arranged to form a second half bridge; and
wherein the at least two MR elements with magnetic reference directions along the third reference axis are arranged to form a third half bridge.

13. The magnetic sensor of claim 12, wherein the first output signal is a first voltage between the first half bridge and the second half bridge;
wherein the second output signal is a second voltage between the second half bridge and the third half bridge; and
wherein the third output signal is a third voltage between the third half bridge and the first half bridge.

14. The magnetic sensor of claim 13, wherein an amplitude of the first voltage depends on an equivalent resistance of the first half bridge and the second half bridge;
wherein an amplitude of the second voltage depends on an equivalent resistance of the second half bridge and the third half bridge; and
wherein an amplitude of the third voltage depends on an equivalent resistance of the third half bridge and the first half bridge.

15. The magnetic sensor of claim 11, wherein the processor is further to:
determine, based on the first output signal, the second output signal, and the third output signal, an angle of rotation of a magnetic field applied to the sensing element.

16. The magnetic sensor of claim 11, wherein the processor is further to:
determine whether a sum of the first output signal, the second output signal, and the third output signal is zero; and
determine, based on the sum being zero, an angle of rotation of a magnetic field applied to the sensing element.

17. The magnetic sensor of claim 11, wherein the processor is further to:
determine, based on based on performing the functional safety check, an angle of rotation of a magnetic field applied to the sensing element.

18. The magnetic sensor of claim 11, wherein the processor, when performing the functional safety check, is to:
determine whether a first vector sum of the first output signal, the second output signal, and the third output signal at a first time is zero; and
determine whether a second vector sum of the first output signal, the second output signal, and the third output signal at a second time is zero.

19. The magnetic sensor of claim 11, wherein the processor, when performing the functional safety check, is to:
determine whether a varying rate of a vector sum of the first output signal, the second output signal, and the third output signal satisfies a threshold rate.

20. The magnetic sensor of claim 19, wherein the processor is further to:
perform one or more actions based on determining that varying rate of the vector sum varies satisfies the threshold rate,
the one or more actions including:
sending a warning message,
raising an error flag, or
disabling a bridge associated with the sensing element.

* * * * *